(12) United States Patent
Fan et al.

(10) Patent No.: US 6,935,038 B2
(45) Date of Patent: Aug. 30, 2005

(54) GAP GAUGE

(75) Inventors: Ping-Ling Fan, Hsin-chu (TW); Te-Hsiang Liu, Hsinchu (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 0 days.

(21) Appl. No.: 10/077,280

(22) Filed: Feb. 14, 2002

(65) Prior Publication Data

US 2003/0150123 A1 Aug. 14, 2003

(51) Int. Cl.⁷ .................................................. G01B 3/00
(52) U.S. Cl. ........................ 33/542; 33/501.45; 33/567
(58) Field of Search .............................. 33/501.45, 567, 33/549, 542, 613, 645, 333

(56) References Cited

U.S. PATENT DOCUMENTS 5,444,921 A * 8/1995 Milina .......................... 33/833
6,323,494 B1 * 11/2001 Lee ........................ 250/442.11
6,359,677 B2 * 3/2002 Itoh et al. ...................... 355/53
6,446,581 B1 * 9/2002 Carbone et al. .......... 122/13.01
6,468,816 B2 * 10/2002 Hunter ......................... 438/14

* cited by examiner

Primary Examiner—Christopher W. Fulton
Assistant Examiner—Yaritza Guadalupe
(74) Attorney, Agent, or Firm—Tung & Associates

(57) ABSTRACT

An apparatus and method for preventing damage to a chamber wall by a baffle plate in a semiconductor fabrication system during a semiconductor fabrication operation is disclosed herein. An electrostatic chuck is associated with the semiconductor fabrication system. A gauge for measuring a gap between said baffle plate and the chamber wall can be utilized to prevent damage to the chamber wall by the baffle plate during a movement of the electrostatic chunk during the semiconductor fabrication operation. Such a semiconductor fabrication operation can comprise, for example, a wet cleaning semiconductor operation.

18 Claims, 5 Drawing Sheets

GAP GAUGE

TECHNICAL FIELD

The present invention relates generally to semiconductor fabrication techniques and devices. The present invention also relates to electrostatic chuck devices utilizes in semiconductor fabrication processes. The present invention also relates to techniques and devices for measuring gap movement during a semiconductor fabrication operation.

BACKGROUND OF THE INVENTION

In the field of thin film technology requirements for thinner deposition layers, better uniformity over increasingly larger area substrates, larger production yields, and higher productivity have been, and still are, driving forces behind emerging technologies developed by equipment manufactures for coating substrates in the manufacturing of various semiconductor devices. For example, process control and uniform film deposition achieved in the production of a microprocessor directly effect clock frequencies that can be achieved. These same factors in combination with new materials also dictate higher packing densities for memories that are available on a single chip or device. As these devices become smaller, the need for greater uniformity and process control regarding layer thickness rises dramatically.

Various technologies well known in the art exist for applying thin films to substrates or other substrates in manufacturing steps for integrated circuits (ICs). Among the more established technologies available for applying thin films, Chemical Vapor Deposition (CVD) and a variation known as Rapid Thermal Chemical Vapor Deposition (RTCVD) are often-used, commercialized processes.

In semiconductor device manufacturing, various types of plasma processes are used to deposit layers of conductive and dielectric material on semiconductor wafers, and also to blanket etch and selectively etch materials from the wafer. During these processes the wafer is affixed to a wafer chuck in a process chamber and a plasma generated adjacent the wafer surface. Various techniques have evolved to affix the wafer to the wafer chuck. A recent technique for holding the wafer is using an electrostatic chuck.

Electrostatic chucks, which use electrostatic attraction forces to hold a substrate, have several advantages over mechanical and vacuum chucks. For example, electrostatic chucks reduce stress-induced cracks caused by mechanical clamps, allow processing of a larger portion of the substrate, and can be used in processes conducted at low pressures. A typical electrostatic chuck comprises an electrode covered by a dielectric. When the electrode is electrically charged, an opposing electrostatic charge accumulates in the substrate and the resultant electrostatic force holds the substrate onto the electrostatic chuck. Once the substrate is firmly held on the chuck, a plasma of gas is used to process the substrate.

Electrostatic chucks are used for holding a workpiece in various applications ranging from holding a sheet of paper in a computer graphics plotter to holding a semiconductor wafer within a semiconductor wafer process chamber. Electrostatic chucks secure a workpiece by creating an electrostatic attractive force between the workpiece and the chuck. A voltage is applied to one or more electrodes in the chuck so as to induce opposite polarity charges in the workpiece and electrodes, respectively. The opposite charges pull the workpiece against the chuck, thereby retaining the workpiece. In semiconductor wafer processing equipment, electrostatic chucks are used for clamping wafers to a support during processing. The support may form both an electrode (in electrostatic chuck applications) and a heat sink. These chucks find use in etching, chemical vapor deposition (CVD), ion implantation, and physical vapor deposition (PVD) applications.

In an electrostatic chuck, a conductive electrode beneath a dielectric wafer support layer is provided. When a high DC voltage is applied to the electrode, positive and negative charges are respectively produced in the wafer and the electrode, so that the wafer is attracted and held on the chuck surface by the Coulomb force acting between the wafer and the electrode. Plasma etching is performed in this state. When the etching is completed, the supply of RF power and the application of the high DC voltage to the electrode are terminated. Subsequently, the processed wafer is unloaded. The electrostatic chuck eliminates the need for mechanical clamp rings, and greatly reduces the probability of forming particles by abrasion etc., which particles cause yield problems and require frequent cleaning of the apparatus.

One of the problems associated with prior art electrostatic chuck configurations utilized in semiconductor fabrication operations involves the inability of prior art devices to prevent damage to particular parts and elements during movement of the electrostatic chuck from one position to another. For example, during the vertical movement of an electrostatic chuck utilizes in association with a chamber apparatus or semiconductor fabrication system, an associated baffle plate can scratch a chamber wall, resulting in chamber wall polymer peeling.

Thus far, a device or technique has not been developed, which can adequately prevent such scratching and damage during movement of the electrostatic chuck from processing to transfer positions and vice versa. The present inventors thus recognize, based on the foregoing, that a need exists for an apparatus and method, which would prevent such damage. A need also exists for a gauge which can be adapted for use with a semiconductor fabrication system for preventing scratching of a chamber wall by a baffle plate during movement of the electrostatic chuck. The present invention thus was designed by the present inventor to address and meet this important need.

BRIEF SUMMARY OF THE INVENTION

The following summary of the invention is provided to facilitate an understanding of some of the innovative features unique to the present invention, and is not intended to be a full description. A full appreciation of the various aspects of the invention can be gained by taking the entire specification, claims, drawings, and abstract as a whole.

It is therefore one aspect of the present invention to provide an improved semiconductor fabrication apparatus and method.

It is another aspect of the present invention to provide an apparatus and method for preventing damage to a chamber wall by a baffle plate in a semiconductor fabrication system.

It is yet another aspect of the present invention to provide an apparatus and method for electrostatic chuck leveling in a semiconductor fabrication system.

It is still another aspect of the present invention to provide an apparatus and method for the prevention of chamber wall polymer peeling and increased particles thereof during semiconductor fabrication operations, such as, wet cleaning processes.

It is also an aspect of the present invention to provide a gauge for monitoring the gap between a baffle plate and chamber level to ensure proper electrostatic chuck leveling and the reduction of particles thereof.

The above and other aspects of the present invention can thus be achieved as is now described. An apparatus and method for preventing damage to a chamber wall by a baffle plate in a semiconductor fabrication system during a semiconductor fabrication operation is disclosed herein. An electrostatic chuck is associated with the semiconductor fabrication system.

A gauge for measuring a gap between the baffle plate and the chamber wall can be utilized to prevent damage to the chamber wall by the baffle plate during a movement of the electrostatic chunk during the semiconductor fabrication operation. Such a semiconductor fabrication operation can comprise, for example, a wet cleaning semiconductor operation. The gauge itself is adapted for use in leveling the electrostatic chunk. The gauge comprises a horizontal gap gauge. Such a gauge can be adapted for use in preventing polymer peeling of the chamber wall. The gauge acts as a leveling gauge. Additionally, the semiconductor fabrication system includes a dual-rotate-magnet (DRM) and a focus ring. The movement of the electrostatic chunk during the semiconductor fabrication operation may comprise a vertical movement or a horizontal movement, depending on the desired implementation and design of the present invention.

BRIEF DESCRIPTION OF THE DRAWINGS

The accompanying figures, in which like reference numerals refer to identical or functionally-similar elements throughout the separate views and which are incorporated in and form part of the specification, further illustrate the present invention and, together with the detailed description of the invention, serve to explain the principles of the present invention.

DETAILED DESCRIPTION OF THE INVENTION

The particular values and configurations discussed in these non-limiting examples can be varied and are cited merely to illustrate embodiments of the present invention and are not intended to limit the scope of the invention.

Figure 1:
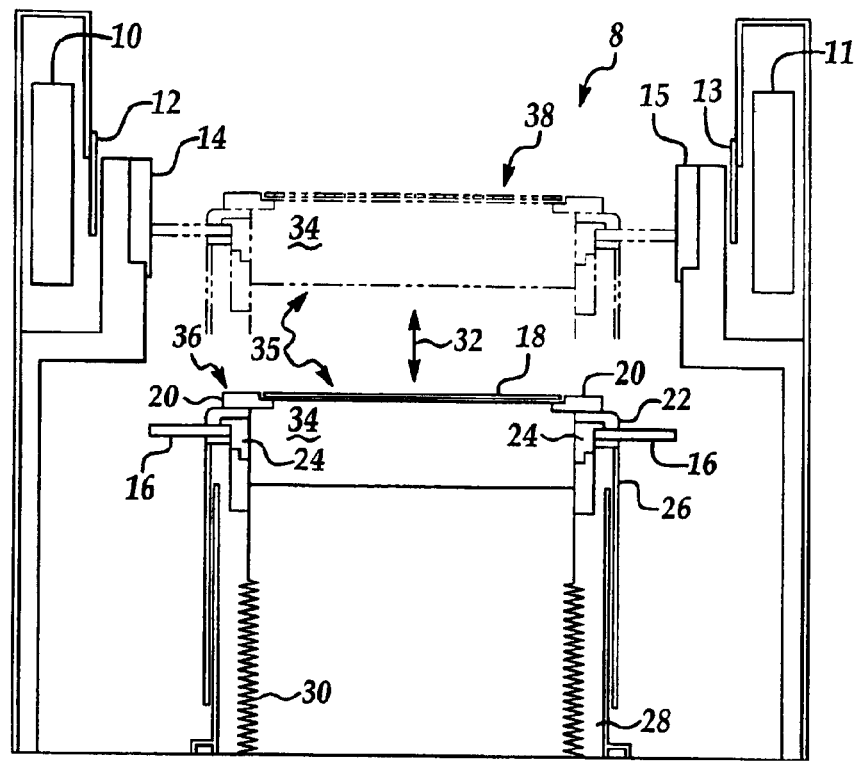
FIG. 1 illustrates a block diagram illustrating a chamber apparatus status, in accordance with a preferred embodiment of the present invention.

FIG. 1 illustrates a block diagram 8 illustrating a chamber apparatus status. Block diagram 8 generally depicts a side sectional view of an electrostatic chuck (ESC) 34 and associated mechanical elements and parts. Note generally that in FIGS. 1 to 4 illustrated herein, identical or analogous elements and parts are indicated by identical reference numerals. ESC 34 is indicated in FIG. 1 at a first position 36 and a second position 38. A gap 35 thus exists between first position 36 and second position 38 of ESC 34. Gap movement is indicated by arrow 32. A transfer position is thus indicated at first position 36 while a process position is indicated at second position 38.

A magnet 10 is generally located to the left of a cover 12, which in turn is located to the left of a gauge 14. A magnet 11 is generally located to the right of a cover 13, which in turn is located to right of a gauge 15. Magnets 10 and 11 may comprise a single integrated magnet which generally surrounds ESC 34 at second position 38 or may comprise two separate magnets, depending on a particular implementation of the apparatus and method of the present invention. Magnets 10 and 11 can be configured, for example, as a dual-rotate magnet (DRM).

Figure 3:
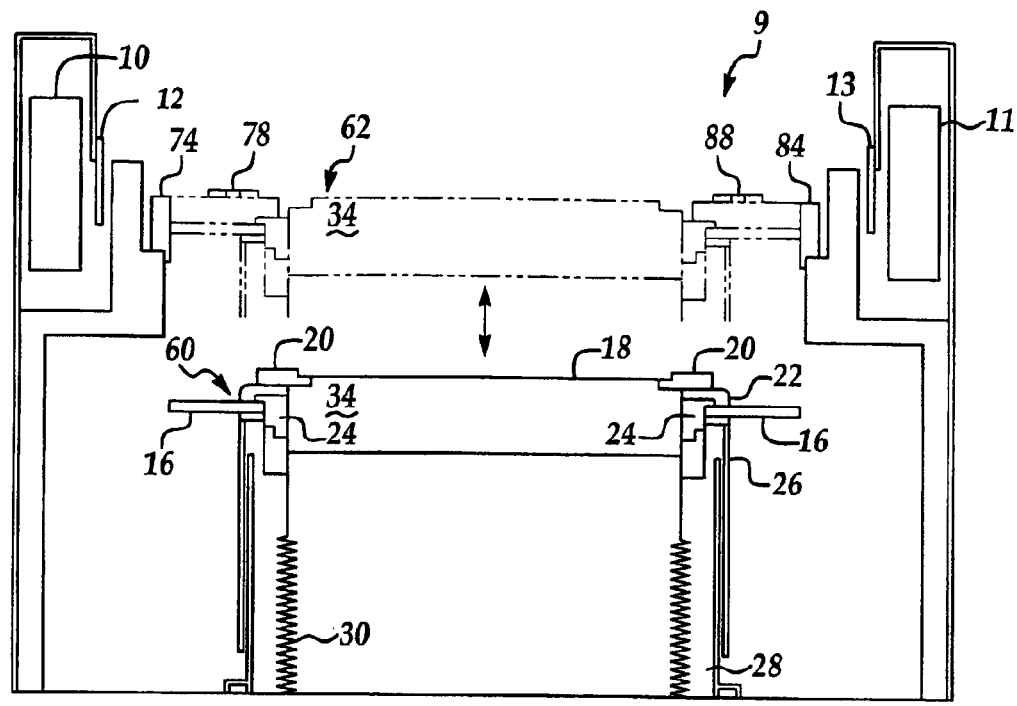
FIG. 3 illustrates a block diagram of a gauge status, in accordance with a preferred embodiment of the present invention.

A baffle plate 16 generally surrounds ESC 34. A focus ring 20 also generally surrounds ESC 34. A semiconductor wafer 18 is generally positioned above ESC 34. A ring portion 24 also generally surrounds ESC 34. A first bellow cover 26 is positioned generally above a second bellow cover 28, while a gap bellow 30 is also depicted in FIG. 3. FIG. 1 thus provides a general illustration of an ESC 34 at first and second positions 36 and 38.

Figure 2:
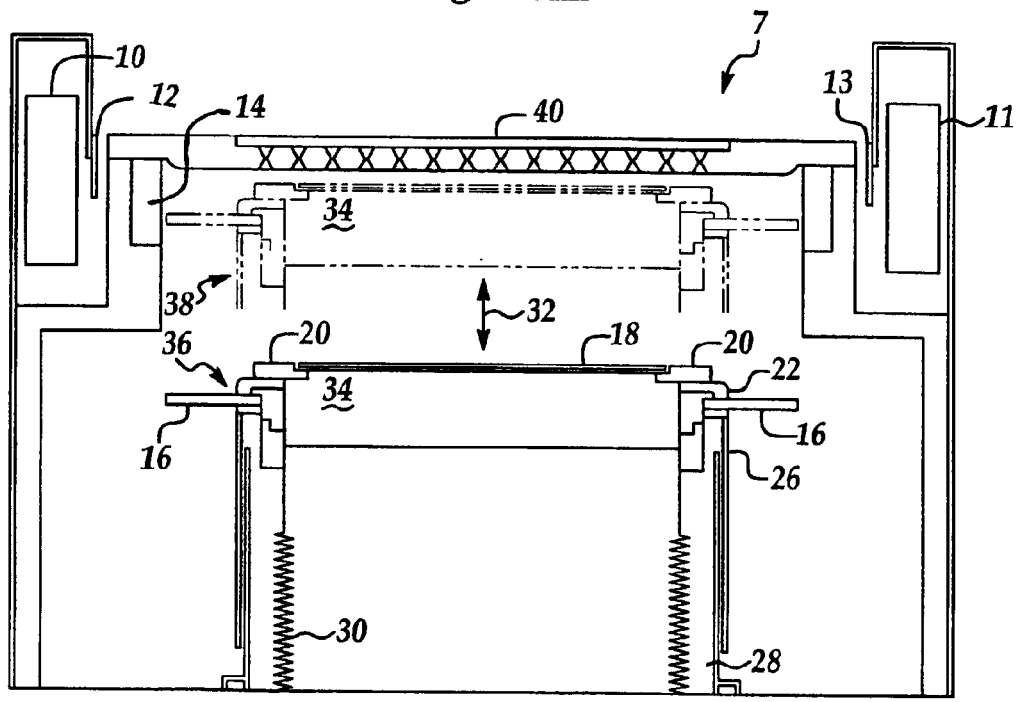
FIG. 2 depicts a block diagram of a chamber status, in accordance with a preferred embodiment of the present invention.

FIG. 2 depicts a block diagram 7 of a chamber apparatus status, in accordance with a preferred embodiment of the present invention. Recall that in FIGS. 1 and 2, like parts are indicated by identical reference numerals. Thus, the primary difference between FIGS. 1 and 2 lies in the illustration of an upper portion 40, which is depicted in FIG. 2. Note that ESC 34 can be utilized for holding a workpiece in various applications ranging from holding a sheet of paper in a computer graphics plotter to holding a semiconductor wafer within a semiconductor wafer process chamber. ESC 34 can generally secure a workpiece by creating an electrostatic attractive force between the workpiece and the chuck.

A voltage can be applied to one or more electrodes in ESC chuck 34 so as to induce opposite polarity charges in the workpiece and electrodes, respectively. The opposite charges pull the workpiece against ESC 34, thereby retaining the workpiece. In semiconductor wafer processing equipment, ESC 34 can be utilized for clamping wafer 18 to a support during processing. The support may form both an electrode (in electrostatic chuck applications) and a heat sink. ESC 34 can thus be utilized in applications such as, for example, etching, chemical vapor deposition (CVD), ion implantation, and physical vapor deposition (PVD) applications.

FIG. 3 illustrates a block diagram 9 of a gauge apparatus status, in accordance with an alternative embodiment of the present invention. As explained previously, in FIGS. 1, 2, and 3, like parts are indicated by identical reference numerals. In FIG. 3, a leveling portion or gauge 78 and 88 are indicated, along with a modified portion 74 of leveling portion/mechanism or gauge 78.

Figure 4:
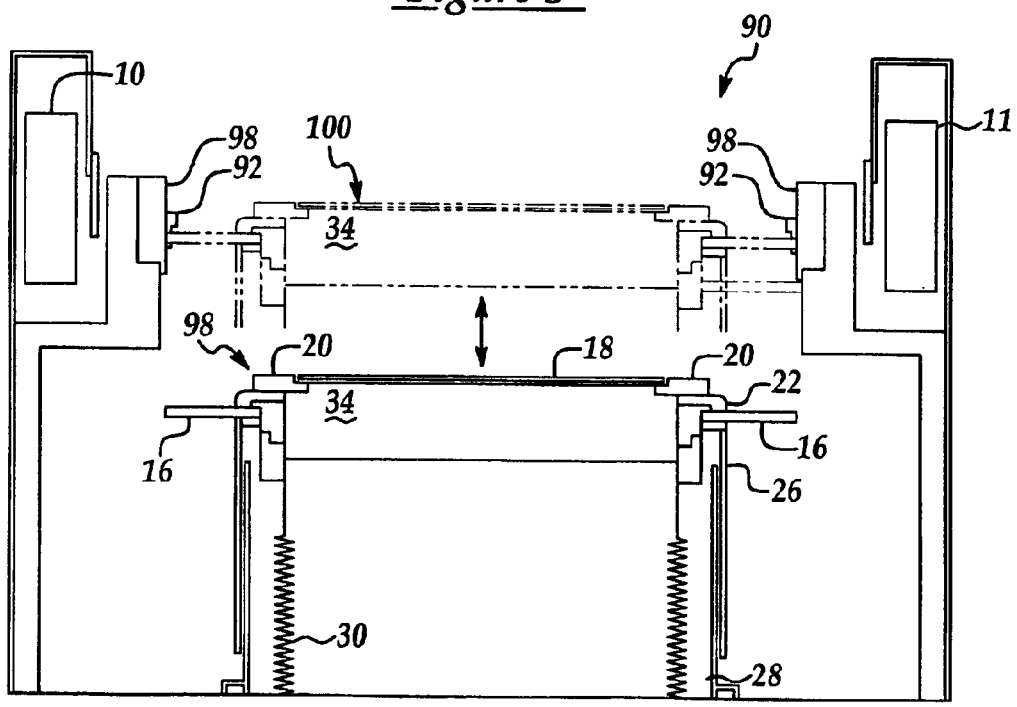
FIG. 4 depicts a prior art block diagram of a gauge status.

FIG. 4 depicts a prior art block diagram 90 of a gauge apparatus status. In the configuration illustrated in FIG. 3, a depo ring 98 generally surrounds ESC 34 when ESC 34 is located at a second position 100. ESC 34 can thus move between a first position 98 and a second position 100. A prior art gauge 92 is also indicated in FIG. 4. As explained previously, prior art gauge 92 cannot properly measure a gap formed between first position 98 and second position 100, which can result in damage to particular parts and elements associated with ESC 34 during a semiconductor processing or fabrication operation.

One of the primary problems associated with prior art block diagram 90 stems from the fact that an associated chamber apparatus can be scratched by baffle plate 16 during movement of ESC 34 in a vertical direction (i.e., up and down) and from a transfer position to a process position (e.g., first position 98 to second position 100). Gauge 92 is inadequate for measuring such a gap movement, unlike the leveling mechanism 78 (i.e. leveling gauge) illustrated in FIG. 3. Leveling mechanism 78 of FIG. 3 is configured in a manner which permits accurate measurement of the gap between a baffle plate, such as, for example, baffle plate 16 and a chamber wall. The configuration illustrated in FIG. 4 does not permit such measurement.

Figure 5:
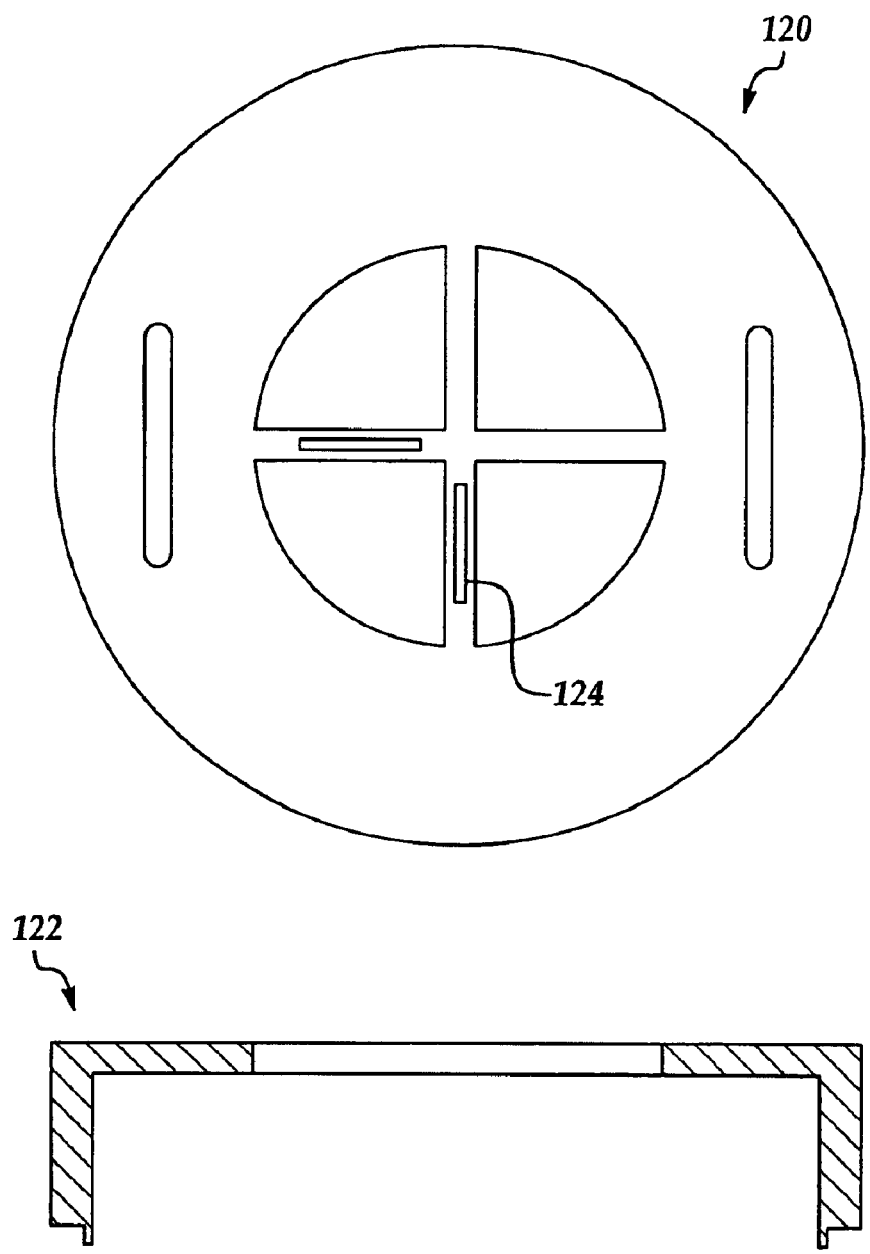
FIG. 5 illustrates top and side sectional views of an ESC horizontal gap, in accordance with a preferred embodiment of the present invention.
Figure 6:
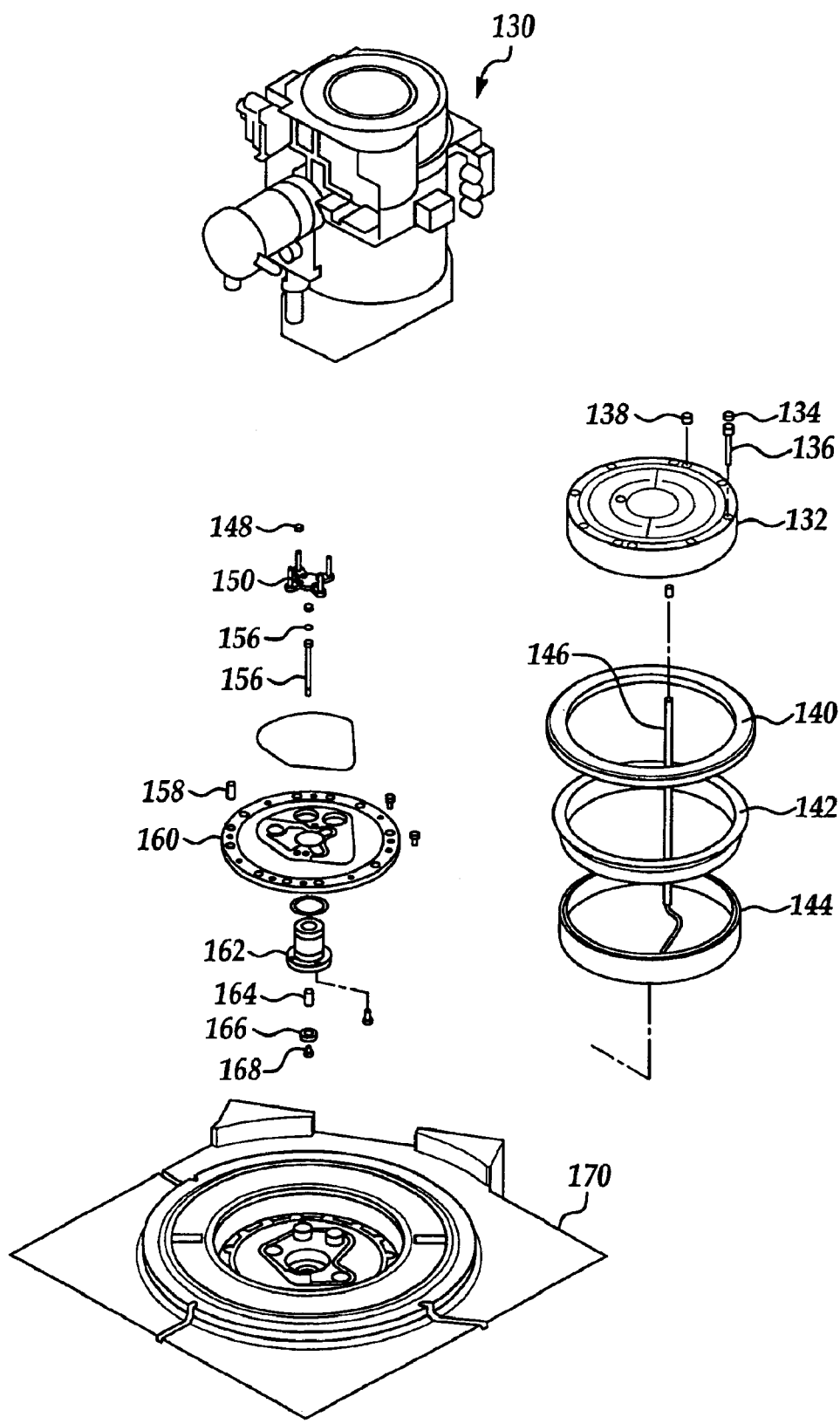
FIG. 6 depicts an exploded view of a chamber apparatus, in accordance with a preferred embodiment of the present invention.

FIG. 5 illustrates top and side sectional views of an ESC horizontal gap, in accordance with a preferred embodiment of the present invention. A top view 120 is illustrated in FIG. 5, along with a side view 122. FIG. 6 depicts an exploded view of a chamber apparatus 130, in accordance with a preferred embodiment of the present invention. Chamber apparatus includes an ESC 132, which can include a nut portion 138, a nut portion 134 and a screw 136, which are positioned above a ring portion 140 and a ring portion 142.

Note that baffle plate 140 illustrated in FIG. 6 is analogous to ring portion 16 indicated in FIGS. 1 to 3 herein. Additionally, ring portion 142 depicted in FIG. 6 is analogous to ring portion 24 of FIGS. 1 to 3. A ring portion 144 is also indicated in FIG. 6. A baffle plate 170 is also indicated in FIG. 6 and can be connected to various mechanical components, such as, for example, mechanical elements 162 to 168 and 148 to 160.

Ring portion 160, for example, can be connected to baffle plate 170 through the integration of screw 168, washer 166, bolt 164 and central connecting portion 162. Note that the elements depicted in FIG. 6 are not considered limiting features of the present invention. Rather, such elements, merely illustrate one possible embodiment, out of many varying embodiments of the present invention.

Figure 7:
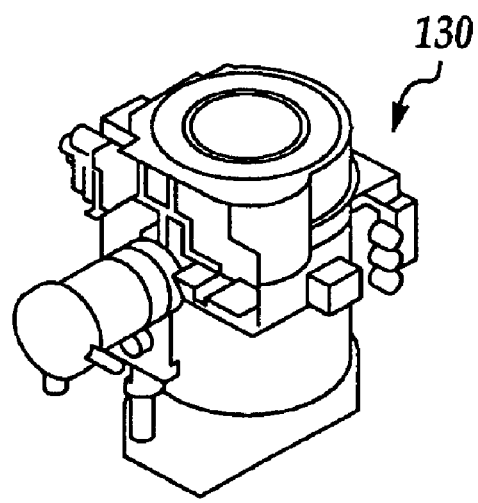
FIG. 7 illustrates an alternative exploded view of the chamber apparatus depicted in FIG. 6.
Figure 7:
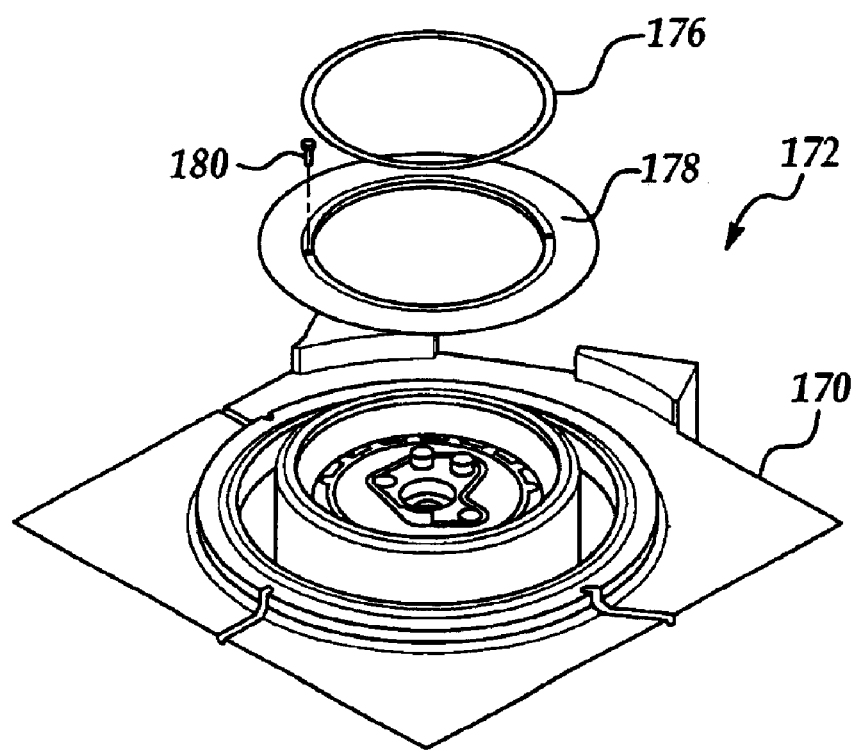

FIG. 7 illustrates an alternative exploded view 172 of the chamber apparatus 130 depicted in FIG. 6. In FIGS. 6 and 7, like parts are indicated by like reference numerals. Baffle plate 170 can thus be integrated with a ring portion 176, a ring portion 178 and a screw 180, as indicated in view 172.

Based on the foregoing, it can be appreciated that the present invention generally describes an apparatus and method for preventing damage to a chamber wall by a baffle plate in a semiconductor fabrication system during a semiconductor fabrication operation is disclosed herein. An electrostatic chuck (e.g., ESC 34) is associated with the semiconductor fabrication system.

A gauge (e.g., leveling mechanism 78) for measuring a gap between the baffle plate and the chamber wall can be utilized to prevent damage to the chamber wall by the baffle plate during a movement of the electrostatic chunk during the semiconductor fabrication operation. Such a semiconductor fabrication operation can comprise, for example, a wet cleaning semiconductor operation. The gauge itself is adapted for use in leveling the electrostatic chunk. The gauge comprises a horizontal gap gauge. Such a gauge can be adapted for use in preventing polymer peeling of the chamber wall. The gauge acts as a leveling gauge. Additionally, the semiconductor fabrication system includes a dual-rotate-magnet (DRM) and a focus ring.

The movement of the electrostatic chunk during the semiconductor fabrication operation may comprise a vertical movement or a horizontal movement, depending on the desired implementation and design of the present invention. Thus, although ESC 24 generally moves vertically from a transfer position to a process position, an alternative design may involves a horizontal movement. The present invention can thus be adapted for use in either horizontal or vertical movements of the ESC.

The embodiments and examples set forth herein are presented to best explain the present invention and its practical application and to thereby enable those skilled in the art to make and utilize the invention. Those skilled in the art, however, will recognize that the foregoing description and examples have been presented for the purpose of illustration and example only. Other variations and modifications of the present invention will be apparent to those of skill in the art, and it is the intent of the appended claims that such variations and modifications be covered.

The description as set forth is thus not intended to be exhaustive or to limit the scope of the invention. Many modifications and variations are possible in light of the above teaching without departing from scope of the following claims. It is contemplated that the use of the present invention can involve components having different characteristics. It is intended that the scope of the present invention be defined by the claims appended hereto, giving full cognizance to equivalents in all respects.

What is claimed is:

1. A gauge apparatus for use in a semiconductor fabrication system, said apparatus comprising:

an electrostatic chuck associated with a semiconductor fabrication system, wherein said electrostatic chuck is moveable from a first horizontal position to a second horizontal position and moveable from a first vertical position to a second vertical position; and a gauge for measuring a gap between a baffle plate and a chamber wall in order to thereby prevent damage to said chamber wall by said baffle plate during a movement of said electrostatic chuck during a semiconductor fabrication operation of said semiconductor fabrication system, wherein said gauge is located proximate to said electrostatic chuck at said second position of said electrostatic chuck, said gauge comprising:

a leveling mechanism for measuring a horizontal gap between said baffle plate and said chamber wall, the leveling mechanism disposed between said electrostatic chuck at said second position of said electrostatic chuck and said chamber wall; and a modified portion mechanically associated with the leveling mechanism.

2. The apparatus of claim 1, wherein said semiconductor fabrication operation comprises a wet cleaning semiconductor operation.

3. The apparatus of claim 1, wherein said gauge is adapted for use in leveling said electrostatic chuck.

4. The apparatus of claim 1, wherein said gauge comprises a horizontal gap gauge.

5. The apparatus of claim 1, wherein said gauge is adapted for use in preventing polymer peeling of said chamber wall.

6. The apparatus of claim 1, wherein said semiconductor fabrication system comprises dual-rotate-magnet (DRM).

7. The apparatus of claim 6 wherein said semiconductor fabrication system comprises a focus ring.

8. The apparatus of claim 7, wherein said movement of said electrostatic chuck during said semiconductor fabrication operation comprises a vertical movement.

9. The apparatus of claim 7, wherein said movement of said electrostatic chuck during said semiconductor fabrication operations comprises a horizontal movement.

10. A method for preventing damage to a chamber wall by a baffle plate in a semiconductor fabrication system during a semiconductor fabrication operation, said method comprising the steps of:

moving an electrostatic chuck associated with said semiconductor fabrication system during said semiconductor fabrication operation; and measuring at least one element selected from a group consisting essentially of a horizontal gap and a vertical gap between said baffle plate and said chamber wall utilizing a gauge having a leveling mechanism and a modified portion, said gauge integrated with said semiconductor fabrication system, in response to moving said electrostatic chuck to thereby prevent damage to said chamber wall by said baffle plate.

11. The method of claim 10, wherein said semiconductor fabrication operation comprises a wet cleaning semiconductor operation.

12. The method of claim 10 wherein said gauge is adapted for use in leveling said electrostatic chuck.

13. The method of claim 10 wherein said gauge comprises a horizontal gap gauge.

14. The method of claim 10 wherein said gauge is adapted for use in preventing polymer peeling of said chamber wall.

15. The method of claim 10 wherein said semiconductor fabrication system comprises dual-rotate-magnet (DRM).

16. The method of claim 15 wherein said semiconductor fabrication system comprises a focus ring.

17. The method of claim 16 wherein said movement of said electrostatic chuck during said semiconductor fabrication operation comprises a vertical movement.

18. The method of claim 16 wherein said movement of said electrostatic chuck during said semiconductor fabrication operation comprises a horizontal movement.

* * * * *